(12) United States Patent
Truong et al.

(10) Patent No.: US 10,852,330 B1
(45) Date of Patent: Dec. 1, 2020

(54) POWER SENSING

(71) Applicant: Silego Technology, Inc., Santa Clara, CA (US)

(72) Inventors: Tom Truong, San Francisco, CA (US); Albert Chen, Saratoga, CA (US); Minghan Chuang, San Jose, CA (US)

(73) Assignee: Silego Technology, Inc., Santa Clara, CA (US)

( * ) Notice: Subject to any disclaimer, the term of this patent is extended or adjusted under 35 U.S.C. 154(b) by 1 day.

(21) Appl. No.: 14/507,741

(22) Filed: Oct. 6, 2014

Related U.S. Application Data

(60) Provisional application No. 61/887,300, filed on Oct. 4, 2013.

(51) Int. Cl.
*G01R 21/06* (2006.01)

(52) U.S. Cl.
CPC ................... *G01R 21/06* (2013.01)

(58) Field of Classification Search
CPC .................. G01R 21/06; G01R 21/00–14
USPC ........................................................ 324/713
See application file for complete search history.

(56) References Cited

U.S. PATENT DOCUMENTS

| | | | | |
|---|---|---|---|---|
| 3,840,813 A * | 10/1974 | Allen | ...................... | G01R 19/02 324/132 |
| 4,118,696 A * | 10/1978 | Warther | ................ | H03M 1/504 324/76.47 |
| 4,315,212 A * | 2/1982 | Gamoh | ................ | G01R 21/127 324/107 |
| 4,660,083 A * | 4/1987 | Allen | ........................ | H04N 9/72 348/673 |
| 5,497,332 A * | 3/1996 | Allen | .................... | G01R 21/133 700/295 |
| 5,917,368 A * | 6/1999 | Tan | ........................... | G05F 1/561 323/315 |
| 7,301,347 B2 * | 11/2007 | Dearn | ................ | G01R 19/0092 324/713 |
| 7,446,433 B2 * | 11/2008 | Masciarelli | ............. | H02J 9/062 307/66 |
| 8,731,007 B2 * | 5/2014 | Bar-Sade | ................. | H04L 12/46 370/538 |
| 9,141,123 B2 * | 9/2015 | McJimsey | ............... | G01R 21/06 |
| 2015/0249464 A1 * | 9/2015 | Cohen | ..................... | H03M 1/18 341/155 |

* cited by examiner

*Primary Examiner* — Melissa J Koval
*Assistant Examiner* — Rahul Maini
(74) *Attorney, Agent, or Firm* — Van Pelt, Yi & James LLP

(57) ABSTRACT

Improved techniques for sensing and reporting power consumption from a single or multiple power supplies are disclosed. The disclosed techniques comprise integrated circuit solutions for sensing power. In some embodiments, an integrated circuit comprises circuitry for converting source voltage into a pulse-width modulation (PWM) signal and circuitry for modulating the PWM signal with a current sense signal to determine sensed power.

48 Claims, 4 Drawing Sheets

POWER SENSING

CROSS REFERENCE TO OTHER APPLICATIONS

This application claims priority to U.S. Provisional Patent Application No. 61/887,300 entitled POWER SENSING filed Oct. 4, 2013 which is incorporated herein by reference for all purposes.

BACKGROUND OF THE INVENTION

Power sensing comprises sensing voltage and current and multiplying to determine consumed power (P=I*V). A commonly employed technique for power sensing includes using a high precision discrete resistor connected in series with a power source. The current through the resistor causes a voltage drop across the resistor. Since the resistor value is known, the current is represented by the voltage drop across the resistor. Power may be determined using an operational amplifier that multiplies current through the sense resistor and the source voltage. For source voltage sensing, an analog-to-digital converter (ADC) may be employed to convert the source voltage value to a digital format. If an ADC is used for both current and source voltage sensing, such digital values may be post processed by a microprocessor.

Conventional power sensing techniques, however, suffer from numerous drawbacks. Complex circuitry is needed for multiplying current and voltage. Such circuitry typically requires high power consumption while providing poor speed performance and overall accuracy. More specifically, conventional techniques for sensing current across active or passive components create conflicting requirements between accuracy and low power dissipation across the components while conventional techniques for sensing source voltage are bound by the absolute voltage rating of the device process technology.

Improved power sensing techniques that do not have the shortcomings of existing techniques would be useful.

BRIEF DESCRIPTION OF THE DRAWINGS

Various embodiments of the invention are disclosed in the following detailed description and the accompanying drawings.

DETAILED DESCRIPTION

Figure 1:
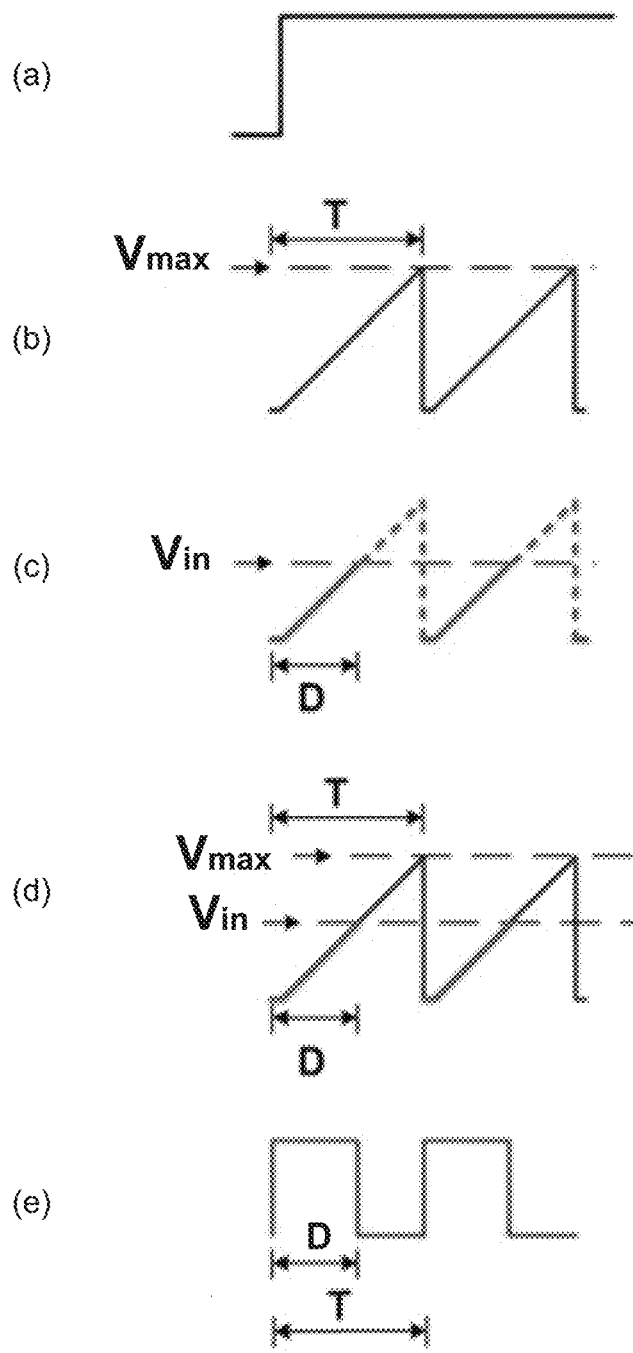
FIG. 1 illustrates an embodiment of representing source voltage in the form of a PWM signal.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims, and the invention encompasses numerous alternatives, modifications, and equivalents. Numerous specific details are set forth in the following description in order to provide a thorough understanding of the invention. These details are provided for the purpose of example, and the invention may be practiced according to the claims without some or all of these specific details. For the purpose of clarity, technical material that is known in the technical fields related to the invention has not been described in detail so that the invention is not unnecessarily obscured.

Power sensing is needed for a system to manage power consumption so that it can operate with power efficiency and avoid power overloading and overheating. Direct power sensing techniques having low overhead cost (e.g., in terms of needed circuitry and power consumption) while providing high accuracy are disclosed herein. In some embodiments, the disclosed power sensing circuitries comprise integrated circuits.

In some embodiments of the disclosed techniques for power sensing, the source voltage (V) is converted into a pulse-width modulation (PWM) signal. Specifically, the source voltage modulates the pulse width of a PWM signal, i.e., the pulse width of the PWM signal corresponds to the magnitude of the source voltage. Thus, the duty cycle of the PWM signal is proportional to the source voltage level. As the source voltage increases, the duty cycle of the PWM signal increases. The maximum source voltage defined for a system corresponds to a 100% duty cycle of the PWM signal representing the source voltage. The PWM signal controls a switch (on/off) for passing sense current (I) onto a resistor. The average current applied to the resistor results in a voltage that represents sensed power. Various aspects and embodiments of this technique for sensing power are further described below.

The aforementioned technique for sensing power may be employed to represent sensed or output power in terms of a fraction or percentage of maximum power as mathematically shown below. Let the sensed power of a system be generally defined by equation (1):

$$P_{sense}(t) = i(t) * v(t) \quad (1)$$

where i(t) is the sensed current and v(t) is the source voltage. If the maximum source voltage of the system is defined by $V_{max}$, the maximum power is defined by equation (2):

$$P_{vmax}(t) = i(t) * V_{max} \quad (2)$$

which can be equivalently re-written in terms of i(t) as in equation (3):

$$i(t) = P_{vmax}/V_{max} \quad (3)$$

using equation (3) to substitute for i(t) in equation (1) and representing the source voltage v(t) as an average yields equation (4):

$$P_{sense} = P_{vmax} * 1/T \int_0^T v(t) dt / V_{max} \quad (4)$$

Let $V_{in}$ represent the average v(t) for one period T. Substituting $V_{in}$ in equation (4) yields equation (5):

$$P_{sense} = P_{vmax} * V_{in}/V_{max} \quad (5)$$

Thus, sensed power can be represented as a percentage or fraction of maximum power, i.e., by scaling $P_{vmax}$ by the ratio $V_{in}/V_{max}$ wherein $V_{max}$ comprises a predetermined maximum source voltage.

The ratio $V_{in}/V_{max}$ can be represented by a PWM signal. FIG. 1 illustrates an embodiment of representing source voltage in the form of a PWM signal. Let the unit step function u(t) be applied to the system as depicted in FIG. 1(a). Integration of the step function u(t) results in a sawtooth function, i.e., a ramp response GO. FIG. 1(b) illustrates a ramp voltage that has peak $V_{max}$ and that is mathematically represented by equation (6):

$$V_{rmax}(t) = I/C \int_0^T u(t)-u(t-T)dt \text{ for } V_{rmax}(t) \leq V_{max} \quad (6)$$

where T is the integration time for $V_{max}$, i.e., the amount of time for the voltage to ramp from 0 to $V_{max}$. Similarly, FIG. 1(c) illustrates a ramp voltage that has peak $V_{in} \leq V_{max}$ and that is mathematically represented by equation (7):

$$V_{rin}(t) = I/C \int_0^D u(t)-u(t-D)dt \text{ for } V_{rin}(t) \leq V_{in} \quad (7)$$

where D is the integration time for $V_{in}$, i.e., the amount of time for the voltage to ramp from 0 to $V_{in}$. In FIG. 1(d), $V_{in}$ and $V_{max}$ are superimposed. The linear relationship between $V_{in}$ and $V_{max}$ is represented by equation (8):

$$V_{in}/V_{max} = D/T \quad (8)$$

FIG. 1(e) illustrates input voltage in the form of a PWM signal. In the PWM signal, T corresponds to one period, and D is the pulse width or duty cycle of the period. Substituting equation (8) into equation (5) yields equation (9):

$$P_{sense} = P_{vmax} * D/T \quad (9)$$

Thus, by representing the input source voltage as a fraction or percentage of the maximum source voltage, the sensed power can be represented by the same fraction or percentage of maximum power.

Figure 2:
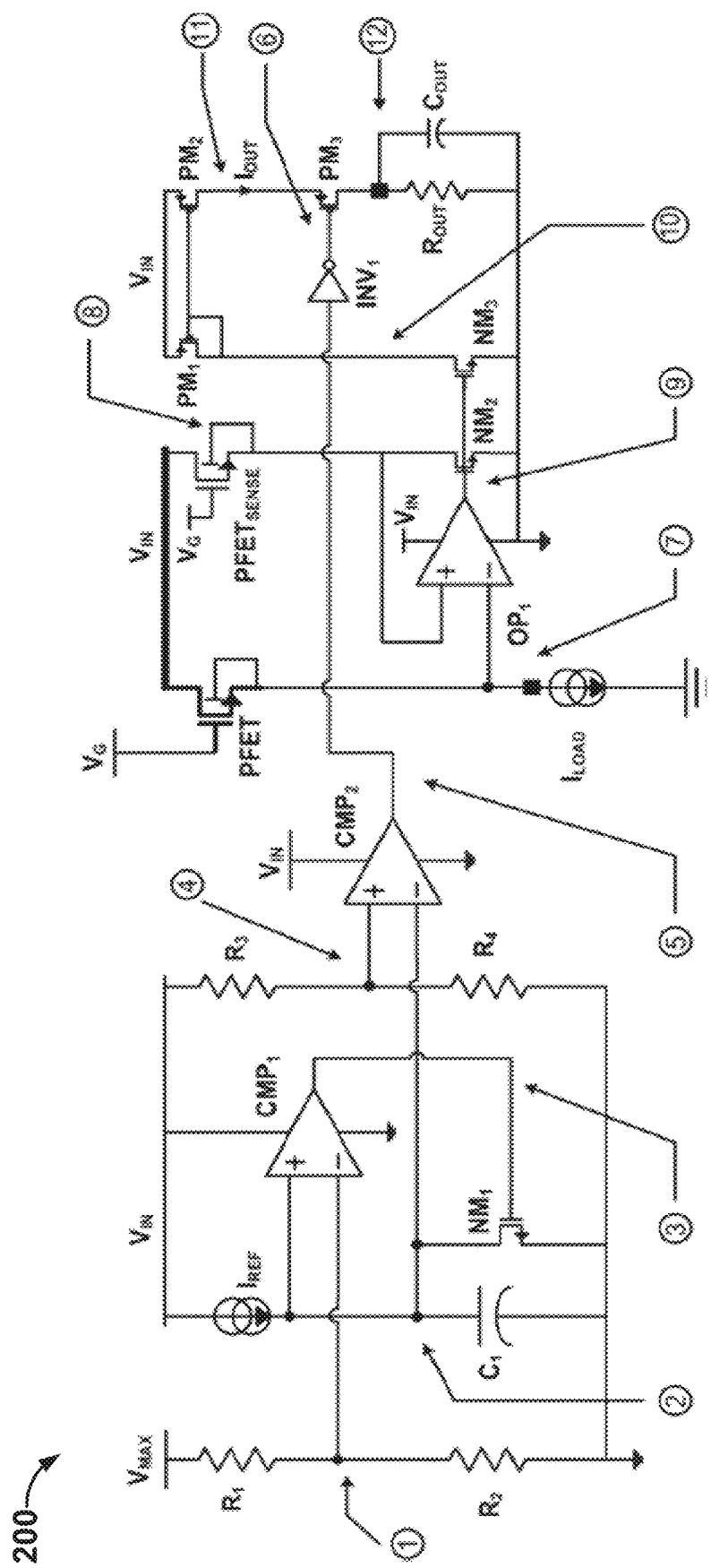
FIG. 2 illustrates an embodiment of a power sensing circuitry.

FIG. 2 illustrates an embodiment of a power sensing circuitry 200. In the given example, the sensed current is modulated with the PWM signal representing $V_{in}$, and the output is a voltage representing sensed power at node 12. A description of the various nodes and portions of circuit 200 follows. In the given example, the nomenclature NM refers to an NMOS transistor (n-type metal-oxide-semiconductor field effect transistor), PM refers to a PMOS transistor (p-type metal-oxide-semiconductor field effect transistor), and PFET refers to a power FET (power metal-oxide-semiconductor field effect transistor).

Node 1 corresponds to a voltage divider for $V_{max}$ that sets a reference voltage for comparator $CMP_1$. Specifically, resistor set $R_1$ and $R_2$ is used to divide down $V_{max}$. In other embodiments, a direct voltage may be applied to node 1, in which case $R_1$ and $R_2$ are not needed.

Node 2 corresponds to a ramp signal generated by applying reference current $I_{ref}$ on capacitor $C_1$. $I_{ref}$ and $C_1$ of FIG. 2 correspond to I and C, respectively, of equations (6) and (7). Comparator $CMP_1$ sets the peak of the ramp signal by turning on switch $NM_1$ when the ramp reaches the level of node 1.

Node 3 corresponds to the output of $CMP_1$ and serves as a control signal of switch $NM_1$. When switch $NM_1$ is turned on, the ramp signal is discharged or pulled down to ground.

Node 4 corresponds to a voltage divider for $V_{in}$ to divide down $V_{in}$ to set the trigger level for comparator $CMP_2$.

Node 5 corresponds to a PWM signal representation of $V_{in}$, e.g., in terms of a fraction or percentage of $V_{max}$. If $R_1 = R_3$ and $R_2 = R_4$, then $V_{in}/V_{max} = D/T$, wherein D comprises the pulse width and T comprises the period of the PWM waveform output by comparator $CMP_2$.

Node 6 corresponds to the inverted version of the node 5 signal. Specifically, inverter $INV_1$ inverts the node 5 signal so that switch $PM_3$ is turned on during "on time" D of the PWM signal.

Node 7 corresponds to the current $I_{load}$ drawn by the system. Specifically, power FET PFET facilitates supplying requisite load current $I_{load}$ to the system. $V_G$ comprises the gate drive or voltage for turning on PFET.

Node 8 corresponds to the output of power FET $PFET_{sense}$. $PFET_{sense}$ is the same element as PFET but of fractional size. The output of $PFET_{sense}$ turns on with $V_G$. Operational amplifier $OP_1$ forces both node 7 and node 8 to be at the same level, therefore, regulating the current of $PFET_{sense}$ to be proportionally equal to the current of PFET. The proportional factor is the size ratio of $PFET_{sense}$ to PFET.

Node 9 corresponds to the output of $OP_1$. The output of $OP_1$ drives $NM_2$ to ensure node 8 is equal to node 7.

Node 10 corresponds to a current sink by $NM_3$ that is proportional to the current sink of $NM_2$. Node 10 forms gate drive with a diode connection on $PM_1$. $PM_1$ provides source current proportional to $PFET_{sense}$. This source current is mirrored on $PM_2$.

Node 11 corresponds to the source current of $PM_2$, which is the sense current $I_{out}$ of PFET. The proportional factor of $I_{out}$ to $I_{load}$ is predetermined by design. For example, this factor can be set by the ratio of $PFET_{sense}/PFET$, $NM_3/NM_2$, and/or $PM_2/PM_1$.

Node 12 corresponds to sensed power. A fraction of current $I_{out}$ is passed on to $R_{out}$. This fraction is based on D/T, i.e., the amount of time switch $PM_3$ is turned on. A longer duty cycle of the PWM signal results in switch $PM_3$ being turned on longer and vice versa. For instance, in the case $V_{in} = V_{max}$, the duty cycle of the PWM signal is 100%, resulting in switch $PM_3$ being continuously on and maximum power being delivered to the load. Likewise, for a PWM signal with 50% duty cycle, switch $PM_3$ is on half the time. $I_{out}$ applied on $R_{out}$ results in voltage conversion representing the sensed power of the system. Sensed power at node 12 is the average power due to $C_{out}$.

Converting source voltage into a PWM signal and modulating it with sensed current for power sensing allows an associated system to manage power efficiently. Although a single voltage supply has been described with respect to the given example, the disclosed technique may be similarly extended for multiple voltage supplies. Moreover, the PFET and $PFET_{sense}$ configuration of FIG. 2 comprises one example of current sensing. In general, the conversion of $V_{in}$ into a PWM signal such as in FIG. 2 and subsequent modulating with a current sense element may be applied with respect to any power management integrated circuit architecture. Power management integrated circuits such as AC-DC converters, DC-DC converters, linear regulators, power/load switches, etc., have current sense elements with respect to which the disclosed techniques may be employed to sense and report system power.

Figure 3:
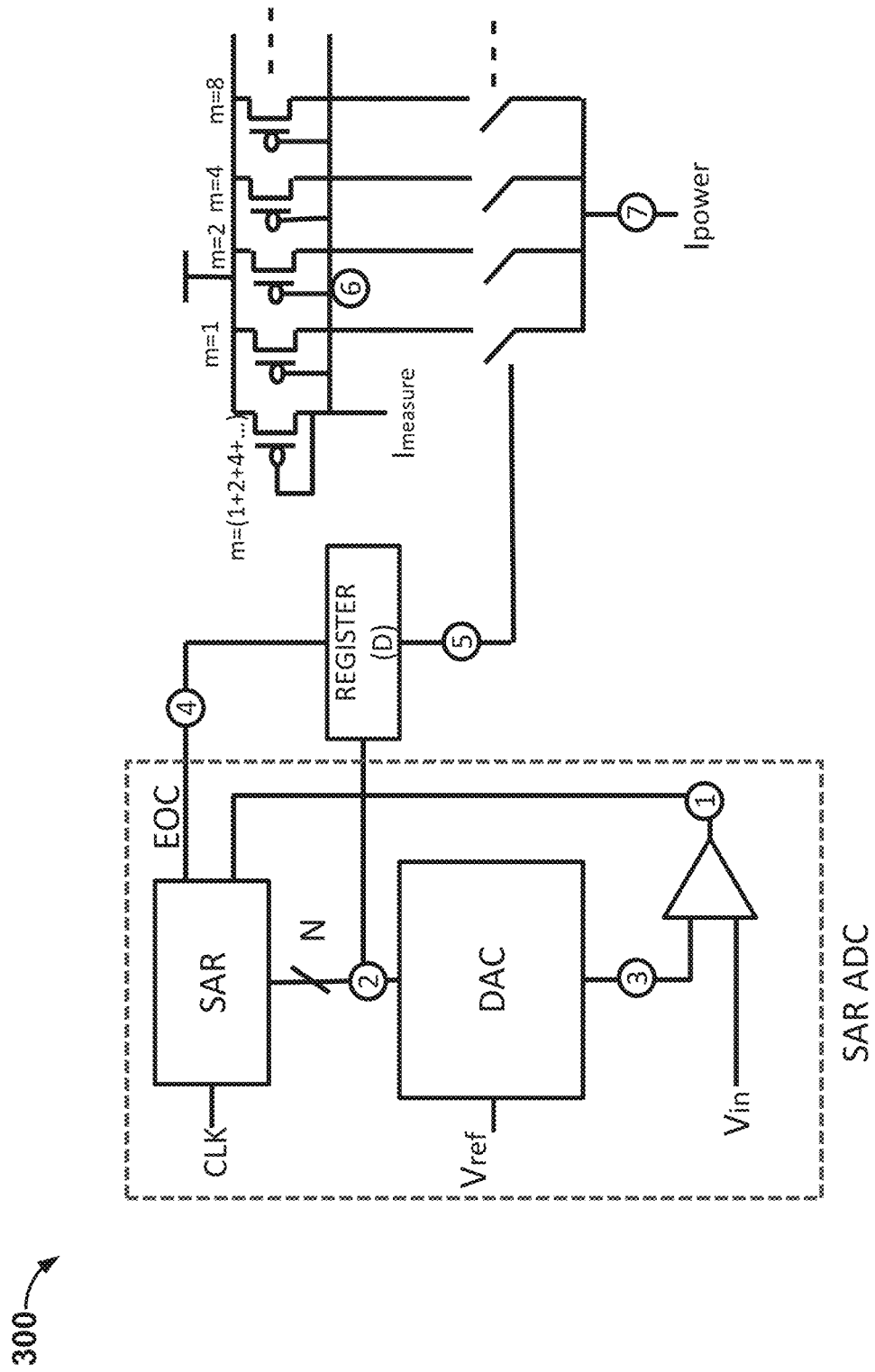
FIG. 3 illustrates an embodiment of a power sensing circuitry.

FIG. 3 illustrates an embodiment of a power sensing circuitry 300. In this example, $V_{in}$ is converted into a digital format, and the output is a current representing sensed power at node 7. More specifically, the successive approximation ADC (SAR ADC) compares $V_{in}$ and $V_{ref}$ to convert $V_{in}$ into an N-bit digital output that represents the ratio $V_{in}/V_{ref}$. For example, if N=8 and $V_{max}$=24V, the 8-bit binary output is 11111111 (i.e., D=255) when $V_{in}$=24V and is 10000000 (i.e., D=128) when $V_{in}$=12V. Thus, in this example, the ratio $V_{in}/V_{ref}$=X=D/255. This N-bit digital output is stored in a register. Measured current $I_{measure}$ is combined with an N-bit current switch. In this example, sensed power is represented as a ratio of measured current, i.e., $I_{power}$=$I_{measure}$*X. A more detailed description of the various nodes and portions of circuit 300 follows. In the given example, SAR refers to a successive approximation register, ADC refers to an analog-to-digital converter, and DAC refers to a digital-to-analog converter.

Node 1 corresponds to the output of an analog voltage comparator that compares $V_{in}$ and the output of the internal DAC of the SAR ADC. The output of the analog voltage comparator is input into the SAR.

Node 2 corresponds to the approximate digital code output of the SAR. Specifically, the SAR sub-circuit is configured to supply an approximate digital code of $V_{in}$ to the internal DAC.

Node 3 corresponds to the output of the internal reference DAC, which comprises an analog voltage equal to the digital code output of the SAR.

Node 4 corresponds to the end of conversion (EOC) output of the SAR. That is, the EOC signal at node 4 indicates when $V_{in}$ has been converted into a digital format. The digital signal is loaded into a register.

In some embodiments, the SAR is initialized so that its MSB (most significant bit) is 1. This code is fed into the DAC, which then supplies the analog equivalent of this digital code ($V_{ref}/2$) into the comparator circuit for comparison with the sampled input voltage $V_{in}$. If this analog voltage exceeds $V_{in}$, the comparator output causes the SAR to reset this bit; otherwise, the bit is left 1. Subsequently, the next bit is set to 1, and the same test is performed. This binary search is continued until every bit in the SAR has been tested. The resulting code is the digital approximation of the sampled input voltage and is finally output by the SAR at the end of the conversion (EOC).

Mathematically, let the normalized input voltage $V_{in}$=x*$V_{ref}$ with x∈[−1, 1]. The objective is to approximately digitize x to an accuracy of $1/2^N$. The following example algorithm may be employed: start with an initial approximation of $x_0$=0 and let the ith approximation be $x_i$=$x_{i-1}$−s($x_{i-1}$−x)/$2^i$, where s(x) is the signum function sgn (x) which is +1 for x≥0 and −1 for x<0. It follows using mathematical induction that $|x_N - x| \leq 1/2^N$.

Node 5 corresponds to an output of an N-bit register that stores the code output by the SAR. The N-bit code in the register controls N switches.

Node 6 corresponds to connecting the measured current $I_{measure}$ to $2^N$ transistors to generate the bias for the ratio current.

Node 7 corresponds to output power $I_{power}$ which is a ratio of $I_{measure}$. Specifically, $I_{power}$=$I_{measure}$*X. Since X=$V_{in}/V_{ref}$, $I_{power}$ is proportional to the ratio of $V_{in}/V_{ref}$.

Figure 4:
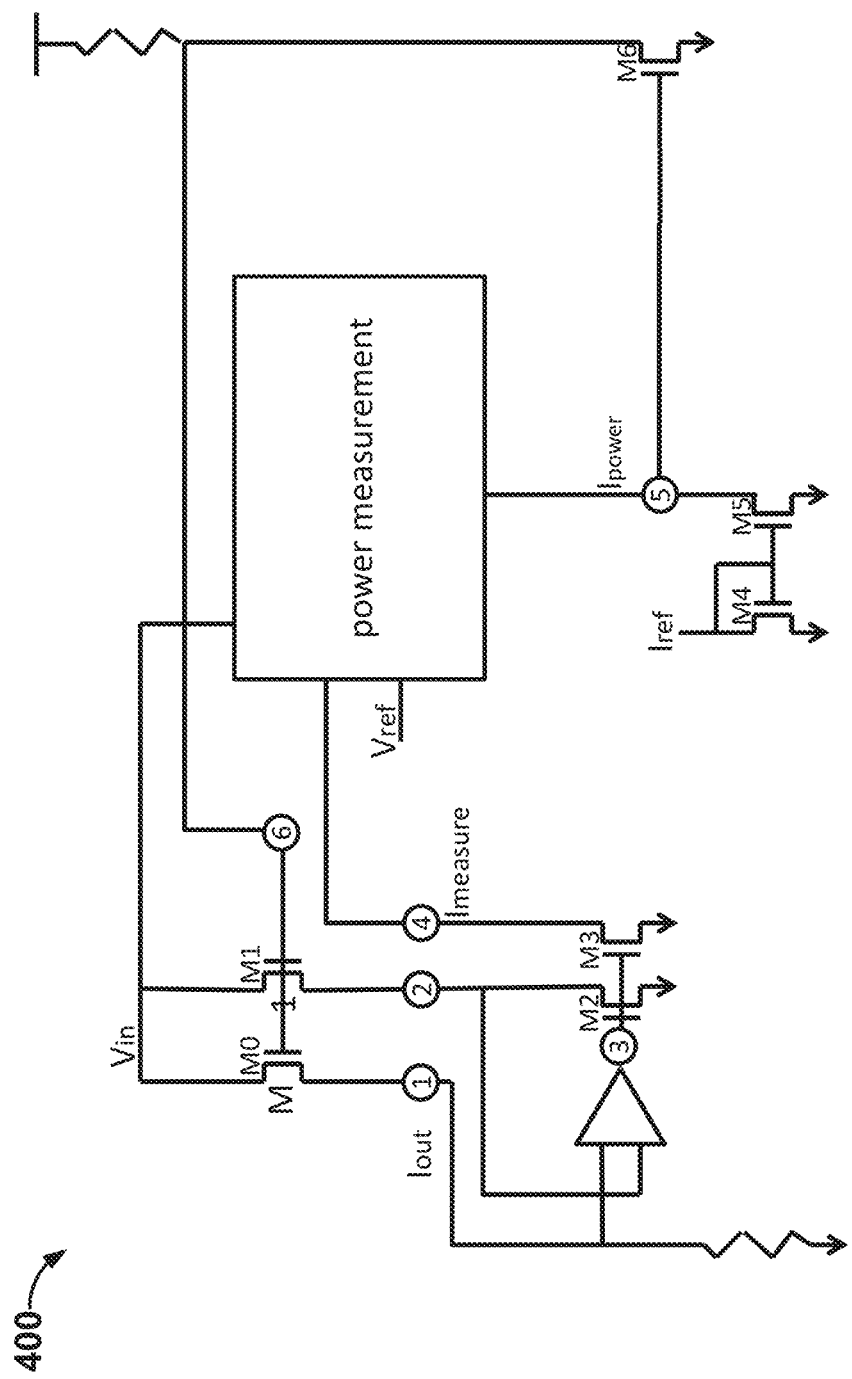
FIG. 4 illustrates an embodiment of a power limiter.

FIG. 4 illustrates an embodiment of a power limiter 400. In some embodiments, sensed power determined using the disclosed techniques may be employed to provide an integrated form of a power limiter that provides flexibility in adjusting current and/or voltage while maintaining a prescribed power. In the given example, an analog voltage comparator compares the source voltages of transistors M0 and M1, and its output goes through transistor M2 to force both sources to be the same voltage. The M1 to M0 ratio is 1:M, i.e., the M0 current is M times larger than the M1 current. The M2 to M3 ratio is hi. Thus, the M2 current is the same as the M3 current, and current $I_{out}$ is M times larger than $I_{measure}$. From the power measurement circuit it is known that $I_{power}$=$I_{measure}$*$V_{in}/V_{ref}$. $I_{ref}$ is a fixed current that represents the desired power limit. Transistors M4 and M5 copy $I_{ref}$ and compare it with $I_{power}$. If $I_{power}$ is higher than $I_{ref}$ then the gate of M6 is pulled high and, in turn, the gates of M0 and M1 are pulled down to reduce $I_{out}$ until $I_{measure}$ and $I_{ref}$ are balanced. In this manner, the total power of the system is limited. A more detailed description of the various nodes and portions of circuit 400 follows.

Node 1 corresponds to the source of transistor M0 and is connected to the non-inverting input of the comparator and to the load resistor.

Node 2 corresponds to the source of transistor M1 and is connected to the inverting input of the comparator and to the drain of transistor M2.

Node 3 corresponds to the output of the analog voltage comparator and is connected to the gates of transistors M2 and M3. The comparator will force its non-inverting and inverting inputs to the same potential and make the current of transistor M0 be M times that of the current of transistor M1. Transistor M3 copies the current of transistor M2. Thus, $I_{measure}$=$I_{out}$/M.

Node 4 corresponds to the drain of transistor M3 and connects to and provides $I_{measure}$ to the power measurement block.

Node 5 corresponds to the $I_{power}$ output of the power measurement block and connects to the drain of transistor M5. Transistor M5 copies $I_{ref}$ from transistor M4. If $I_{power}$>$I_{ref}$, node 5 pulls high and drives the gate of transistor M6 high.

Node 6 connects the drain of transistor M6 to a pull up resistor and drives the gates of transistors M0 and M1. Transistor M6 pulls node 6 low when $I_{power}$>$I_{ref}$. When node 6 lowers, it pushes node 1 and node 2 lower (i.e., for NMOS transistors M0 and M1, lowering the gate lowers the source too) and reduces $I_{out}$ and $I_{measure}$. $I_{measure}$ will be pushed lower until $I_{measure}$=$I_{ref}$. In this manner, the system will maintain a constant power that is set by $I_{ref}$.

A numerical example of the power limiter circuitry follows. Assume for this example that the ratio M0:M1=M=1000000, $I_{ref}$=$I_{power}$=1 µA, and $V_{ref}$=24V. As previously determined, $I_{power}$=$I_{measure}$*X. For $V_{in}$=12V: $V_{in}/V_{ref}$=X=½, so $I_{measure}$=$I_{power}$/X=2 uA and $I_{out}$=measure M=2 A. For this case, total power is $V_{in}$*$I_{out}$=12V*2 A=24 Watts. Likewise, for $V_{in}$=24V: $V_{in}/V_{ref}$=X=1, so $I_{measure}$=$I_{power}$/X=1 µA and $I_{out}$=$I_{measure}$ M=1 A. For this case, total power is $V_{in}$*$I_{out}$=24V*1 A=24 Watts. From this example, it can be seen that $I_{ref}$=1 uA implies a power limit of 24 Watts. When $V_{in}$ is higher (e.g., 24V), the allowed current $I_{out}$ is lower (e.g., 1A) while when $V_{in}$ is lower (e.g., 12V), the allowed current $I_{out}$ is higher (e.g., 2A).

The disclosed techniques comprise integrated circuit solutions for sensing and reporting power consumption and comprise numerous advantages. The ability to use an integrated solution to sense power consumption allows an associated system to manage power to optimize efficiency and prevent power overloading. Moreover, power may be sensed from a single voltage supply or from multiple voltage supply sources. In the case of multiple voltage supplies, sensed power may be summed with a single bus line. Furthermore, the disclosed techniques eliminate the need for operational amplifiers to multiply the sense current and voltage source, do not have a voltage constraint due to silicon process technology but rather can sense source voltage and current higher than the process technology of the circuit, and generally have fewer sources of errors.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. An integrated circuit, comprising:
    circuitry to convert a source voltage into a pulse-width modulation (PWM) signal, wherein the PWM signal represents the source voltage as a fraction or percentage of a maximum source voltage of a power supply of an associated system and wherein the fraction or percentage comprises an amount of time to ramp from zero to the source voltage divided by an amount of time to ramp from zero to the maximum source voltage; and
    a switch controlled by the PWM signal, wherein a current sense signal is applied to a resistor for an amount of time the switch is turned on based on a duty cycle of the PWM signal to determine a sensed power of the associated system, wherein the current sense signal is proportional to a load current drawn by the system by a factor set by a transistor ratio of transistors of the integrated circuit, wherein the sensed power is the same fraction or percentage of a maximum power of the power supply of the associated system, and wherein the integrated circuit does not have a voltage constraint due to silicon process technology but rather senses source voltage and current higher than a process technology of the integrated circuit.

2. The integrated circuit of claim 1, wherein the source voltage modulates a pulse width of the PWM signal.

3. The integrated circuit of claim 1, wherein a pulse width of the PWM signal depends on a magnitude of the source voltage.

4. The integrated circuit of claim 1, wherein the duty cycle of the PWM signal is proportional to the source voltage.

5. The integrated circuit of claim 1, wherein the duty cycle of the PWM signal is 100% when the source voltage comprises the maximum source voltage.

6. The integrated circuit of claim 1, wherein the source voltage comprises the maximum source voltage scaled by a ratio comprising the duty cycle of the PWM signal.

7. The integrated circuit of claim 1, wherein the switch comprises a transistor.

8. The integrated circuit of claim 7, wherein the transistor comprises a PMOS (p-type metal-oxide-semiconductor field effect) transistor.

9. The integrated circuit of claim 1, wherein the sensed power comprises maximum power scaled by a ratio.

10. The integrated circuit of claim 9, wherein the ratio comprises source voltage divided by maximum source voltage.

11. The integrated circuit of claim 9, wherein the ratio comprises the duty cycle of the PWM signal.

12. The integrated circuit of claim 1, wherein the source voltage is provided by a single voltage supply.

13. The integrated circuit of claim 1, wherein the sensed power comprises sensed power values summed from a plurality of voltage supplies.

14. The integrated circuit of claim 1, wherein the sensed power is represented by a voltage.

15. The integrated circuit of claim 1, wherein the sensed power is represented by a current.

16. The integrated circuit of claim 1, further comprising circuitry for limiting power.

17. A method, comprising:
    configuring circuitry of an integrated circuit to convert a source voltage into a pulse-width modulation (PWM) signal, wherein the PWM signal represents the source voltage as a fraction or percentage of a maximum source voltage of a power supply of an associated system and wherein the fraction or percentage comprises an amount of time to ramp from zero to the source voltage divided by an amount of time to ramp from zero to the maximum source voltage; and
    controlling a switch of the integrated circuit using the PWM signal, wherein a current sense signal is applied to a resistor for an amount of time the switch is turned on based on a duty cycle of the PWM signal to determine a sensed power of the associated system, wherein the current sense signal is proportional to a load current drawn by the system by a factor set by a transistor ratio of transistors of the integrated circuit, wherein the sensed power is the same fraction or percentage of a maximum power of the power supply of the associated system, and wherein the integrated circuit does not have a voltage constraint due to silicon process technology but rather senses source voltage and current higher than a process technology of the integrated circuit.

18. The method of claim 17, wherein the switch comprises a transistor.

19. The method of claim 18, wherein the transistor comprises a PMOS (p-type metal-oxide-semiconductor field effect) transistor.

20. The method of claim 17, wherein the source voltage modulates a pulse width of the PWM signal.

21. The method of claim 17, wherein a pulse width of the PWM signal depends on a magnitude of the source voltage.

22. The method of claim 17, wherein the duty cycle of the PWM signal is proportional to the source voltage.

23. The method of claim 17, wherein the duty cycle of the PWM signal is 100% when the source voltage comprises the maximum source voltage.

24. The method of claim 17, wherein the source voltage comprises the maximum source voltage scaled by a ratio comprising the duty cycle of the PWM signal.

25. The method of claim 17, wherein the sensed power comprises maximum power scaled by a ratio.

26. The method of claim 25, wherein the ratio comprises source voltage divided by maximum source voltage.

27. The method of claim 25, wherein the ratio comprises the duty cycle of the PWM signal.

28. The method of claim 17, wherein the source voltage is provided by a single voltage supply.

29. The method of claim 17, wherein the sensed power comprises sensed power values summed from a plurality of voltage supplies.

30. The method of claim 17, wherein the sensed power is represented by a voltage.

31. The method of claim 17, wherein the sensed power is represented by a current.

32. The method of claim 17, further comprising configuring circuitry for limiting power.

33. A computer program product embodied in a non-transitory computer readable storage medium and comprising computer instructions for:
    configuring circuitry of an integrated circuit to convert a source voltage into a pulse-width modulation (PWM) signal, wherein the PWM signal represents the source voltage as a fraction or percentage of a maximum source voltage of a power supply of an associated system and wherein the fraction or percentage comprises an amount of time to ramp from zero to the source voltage divided by an amount of time to ramp from zero to the maximum source voltage; and controlling a switch of the integrated circuit using the PWM signal, wherein a current sense signal is applied to a resistor for an amount of time the switch is turned on based on a duty cycle of the PWM signal to determine a sensed power of the associated system, wherein the current sense signal is proportional to a load current drawn by the system by a factor set by a transistor ratio of transistors of the integrated circuit, wherein the sensed power is the same fraction or percentage of a maximum power of the power supply of the associated system, and wherein the integrated circuit does not have a voltage constraint due to silicon process technology but rather senses source voltage and current higher than a process technology of the integrated circuit.

34. The computer program product of claim 33, wherein the source voltage modulates a pulse width of the PWM signal.

35. The computer program product of claim 33, wherein a pulse width of the PWM signal depends on a magnitude of the source voltage.

36. The computer program product of claim 33, wherein the duty cycle of the PWM signal is proportional to the source voltage.

37. The computer program product of claim 33, wherein the duty cycle of the PWM signal is 100% when the source voltage comprises the maximum source voltage.

38. The computer program product of claim 33, wherein the source voltage comprises the maximum source voltage scaled by a ratio comprising the duty cycle of the PWM signal.

39. The computer program product of claim 33, wherein the switch comprises a transistor.

40. The computer program product of claim 39, wherein the transistor comprises a PMOS (p-type metal-oxide-semiconductor field effect) transistor.

41. The computer program product of claim 33, wherein the sensed power comprises maximum power scaled by a ratio.

42. The computer program product of claim 41, wherein the ratio comprises source voltage divided by maximum source voltage.

43. The computer program product of claim 41, wherein the ratio comprises the duty cycle of the PWM signal.

44. The computer program product of claim 33, wherein the source voltage is provided by a single voltage supply.

45. The computer program product of claim 33, wherein the sensed power comprises sensed power values summed from a plurality of voltage supplies.

46. The computer program product of claim 33, wherein the sensed power is represented by a voltage.

47. The computer program product of claim 33, wherein the sensed power is represented by a current.

48. The computer program product of claim 33, further comprising computer instructions for configuring circuitry for limiting power.

* * * * *

UNITED STATES PATENT AND TRADEMARK OFFICE
CERTIFICATE OF CORRECTION

PATENT NO. : 10,852,330 B1
APPLICATION NO. : 14/507741
DATED : December 1, 2020
INVENTOR(S) : Tom Truong, Albert Chen and Minghan Chuang It is certified that error appears in the above-identified patent and that said Letters Patent is hereby corrected as shown below:

In the Specification

In Column 3, Line(s) 14, delete "GO" and insert --$V_r(t)$--, therefor.

In Column 6, Line(s) 2, delete "hi" and insert --1:1--, therefor.

In Column 6, Line(s) 46-47, delete "$I_{out}$=measure M=2 A" and insert --$I_{out}$=$I_{measure}$ *M=2A--, therefor.

In Column 6, Line(s) 49, delete "$I_{out}$=$I_{measure}$ M=1 A" and insert --$I_{out}$=$I_{measure}$ *M=1A--, therefor.

Signed and Sealed this
Twenty-second Day of November, 2022

Katherine Kelly Vidal
*Director of the United States Patent and Trademark Office*